(12) United States Patent
Kikukawa et al.

(10) Patent No.: US 6,461,710 B1
(45) Date of Patent: *Oct. 8, 2002

(54) OPTICAL RECORDING MEDIUM

(75) Inventors: Takashi Kikukawa; Hajime Utsunomiya, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/456,404

(22) Filed: Dec. 8, 1999

(30) Foreign Application Priority Data

Dec. 9, 1998 (JP) .......................... 10-368538
Nov. 17, 1999 (JP) .......................... 11-327518

(51) Int. Cl.$^7$ .............................................. B32B 3/02
(52) U.S. Cl. .................... 428/64.1; 428/64.5; 428/64.6; 430/270.13
(58) Field of Search ................... 428/64.1, 64.4, 428/64.5, 64.6, 913; 430/270.13, 495.1, 945; 369/283, 288

(56) References Cited

U.S. PATENT DOCUMENTS 6,329,036 B1 * 12/2001 Kikukawa .................. 428/64.1

FOREIGN PATENT DOCUMENTS

| JP | 2-96926 | 4/1990 |
| JP | 5-89511 | 4/1993 |
| JP | 5-109117 | 4/1993 |
| JP | 5-109119 | 4/1993 |
| JP | 7-169094 | 7/1995 |

OTHER PUBLICATIONS

J. Tominaga, et al. "An Approach for Recording and Read-out Beyond the Diffraction Limit with an Sb Thin Film," Applied Physics Letters, vol. 73, No. 15, 1998, pp. 2078–2080.

* cited by examiner

*Primary Examiner*—Elizabeth Mulvaney
(74) *Attorney, Agent, or Firm*—Oblon, Spivak, McClelland, Maier & Neustadt, P.C.

(57) ABSTRACT

In an optical recording medium wherein a layer of nonlinear optical material and a recording layer of phase change type are formed extreme close to each other to enable reading of small record marks beyond diffraction limit, a high C/N is realized and decrease of the C/N in the reading is also suppressed. More illustratively, the optical recording medium has a mask layer (nonlinear optical material layer) and a recording layer of phase change type formed to sandwich an intermediate dielectric layer such that an optical aperture can be formed in the mask layer by irradiation of reading light beam from the side of the mask layer. The intermediate dielectric layer has a thickness of 5 to 70 nm; or near field light generated near the optical aperture is used in the reading. The recording layer contains Ag, In, Sb and Te as its main components and Ge and/or N as its subcomponent.

17 Claims, 1 Drawing Sheet

READNG LIGHT BEAM

READNG LIGHT BEAM

OPTICAL RECORDING MEDIUM

BACKGROUND OF THE INVENTION

1. Field of the Invention

This invention relates to an optical recording medium of phase change type wherein a small record mark beyond diffraction limit can be read.

2. Prior Art

Highlight is recently focused on optical recording media capable of recording information at a high density and erasing the recorded information for overwriting. One typical overwritable optical recording medium is phase change optical recording medium wherein a laser beam is directed to the recording layer to change its crystalline state whereupon a change in reflectance by the crystallographic change is detected for reading of the information. The phase change optical recording media are of great interest since the medium can be overwritten by modulating the intensity of a single laser beam and the optical system of the drive unit is simple as compared to magnetooptical recording media.

Most optical recording media of phase change type used chalcogenide systems such as Ge—Te system and Ge—Sb—Te system which provide a substantial difference in reflectance between crystalline and amorphous states and have a relatively stable amorphous state. It was also recently proposed to use new compounds known as chalcopyrites. Chalcopyrite compounds have been investigated as compound semiconductor materials and have been applied to solar batteries and the like. The chalcopyrite compounds are composed of $Ib-IIIb-VIb_2$ or $IIb-IVb-Vb_2$ as expressed in terms of the Groups of the Periodic Table and have two stacked diamond structures. The structure of chalcopyrite compounds can be readily determined by X-ray structural analysis and their basic characteristics are described, for example, in Physics, Vol. 8, No. 8 (1987), pp. 441 and Denki Kagaku (Electrochemistry), Vol. 56, No. 4 (1988), pp. 228. Among the chalcopyrite compounds, $AgInTe_2$ is known to be applicable as a recording material by diluting it with Sb or Bi. The resulting optical recording media are generally operated at a linear velocity of about 7 m/s. See Japanese Patent Application Kokai Nos. (JP-A) 240590/1991, 99884/1991, 82593/1991, 73384/1991, and 151286/1992. In addition to the optical recording media of phase change type wherein chalcopyrite compounds are used, optical recording media of phase change type wherein $AgSbTe_2$ phase is formed with the crystallization of the recording layer is disclosed in JP-A 267192/1992, 232779/1992, and 166268/1994.

When information is recorded on the optical recording medium of phase change type, the entire recording layer is first brought into crystalline state, and then, a laser beam of high power (recording power) is applied so that the recording layer is heated to a temperature higher than the melting point. In the region where the recording power is applied, the recording layer is melted and thereafter quenched to form an amorphous record mark. When the record mark is erased, a laser beam of relatively low power (erasing power) is applied so that the recording layer is heated to a temperature higher than the crystallization temperature and lower than the melting temperature. The record mark to which the laser beam of erasing power is applied is heated to a temperature higher than the crystallization temperature and then allowed to slowly cool to recover the crystalline state. Accordingly, in the optical recording media of the phase change type, the medium can be overwritten by modulating the intensity of a single light beam.

In general, recording density of optical recording media including optical recording media of phase change type can be increased to a level higher than that of magnetic recording media. Today, further increase in the recording density is demanded for processing an enormous amount of information as in the case of image processing. Recording density per unit area can be increased either by reducing the track pitch, or by increasing linear recording density through shortening of the space between the record marks. An excessively high track density or an excessively high linear recording density in relation to beam spot of the reading light beam, however, invites lowering of C/N, and signal reading eventually becomes impossible. Resolution in the signal reading is determined by the diameter of the beam spot, and more illustratively, diffraction limit is generally $2NA/\lambda$, which is spacial frequency at the reading light beam wavelength of $\lambda$ and numerical aperture NA of the optical system in the reading system. Accordingly, use of the reading light beam with a shorter wavelength and increase in NA are effective for increasing the C/N in the reading and for improving the resolution. A number of proposals have been made through many technical investigations, and such proposals present a wide variety of technological challenges.

JP-A 96926/1990 proposes a recording matrix having a layer comprising a nonlinear optical material for realizing super-resolution. The nonlinear optical materials proposed in JP-A 96926/1990 are materials whose optical properties change by irradiation with a radiation, and such change in the optical properties include change in transparency, reflectance, and refractive index as well as change in the configuration of the layer. Reading out of a smaller region is enabled by irradiation of the information-bearing surface with the reading light beam through the layer of such nonlinear optical material.

In JP-A 96926/1990, a breaching layer is proposed as the layer of the nonlinear optical material. This breaching layer exhibits increase in transparency with the increase in the intensity of the incident radiation, and exemplary materials indicated for the breaching layer are GaAs, InAs, and InSb. In the case of the layer comprising such nonlinear optical material, a reading light beam of high energy density is required since all of absorption center should be excited.

JP-A 89511/1993, 109117/1993, and 109119/1993 disclose optical discs comprising a substrate having optically readable phase pits formed thereon and a layer of the material that exhibits reflectance change by temperature. The layer of such material is a layer which functions in a way substantially the same as the nonlinear material layer of JP-A 96926/1990, and this layer is provided for the purpose of realizing a resolution beyond that determined by the wavelength $\lambda$ of the reading light and the numerical aperture NA of the objective lens. This layer, however, requires a reading light of high power since change from crystalline to liquid state or from amorphous to liquid state is required in such layer.

JP-A 169094/1995 discloses an optical recording medium wherein a recording layer of phase change type and a mask layer are disposed with an intervening intermediate dielectric layer. This mask layer is a layer which functions in substantially the same way as the nonlinear material layer of JP-A 96926/1990, and comprises a phase change material. In the reading of this optical recording medium, the mask layer is melted to reduce the imaginary part of the complex refractive index in the range of 0.25 to 1.0 to thereby enable reading of a small record mark through the molten part of the mask region.

A further improvement recently proposed in the diffraction limit is use of near field light. Appl. Phys. Lett., Vol.73, No.15, pp.2078–2080, 1998, for example, adopts a structure similar to the super-resolution medium described in JP-A 96926/1990, and in this structure, the distance between the nonlinear optical material layer and the recording layer is reduced to enable use of near field light for improving the diffraction limit. In this report, the nonlinear optical material layer comprising Sb and the recording layer comprising $Ge_2Sb_2Te_5$ are formed to sandwich a SiN layer of 20 nm thick, and there is stated that such structure has enabled to read out record marks of 100 nm or less. It should be noted that, in the Example of JP-A 169094/1995, the distance between the nonlinear optical material layer (mask layer in JP-A 169094/1995) and the recording layer (i.e. the thickness of the intermediate dielectric layer in JP-A 169094/1995) is 180 nm, and such distance between the nonlinear optical material layer and the recording layer is far greater than that described in Appl. Phys. Lett., Vol.73, No.15, pp.2078–2080, 1998.

The inventors of the present invention produced the medium described in Appl. Phys. Lett., Vol.73, No.15, pp.2078–2080, 1998, and actually read the thus produced medium. In this attempt, readability of the record marks was confirmed. Initial C/N, however, was quite low and the C/N experienced a rapid drop with the signal reading and the medium soon became unreadable. In short, the medium had poor initial properties and impractical reading stability. In the investigation for the reason of such poor stability, it was found that such poor stability was caused by substantial erasing of the record marks after quite short period due to the reading power of relatively high energy level applied to the medium in order to change the optical properties of the nonlinear optical material layer.

SUMMARY OF THE INVENTION

In view of the situation as described above, an object of the present invention is to realize a high C/N and to suppress decrease of the C/N in the reading in an optical recording medium wherein reading of small record marks beyond diffraction limit is enabled by forming the layer of nonlinear optical material and the recording layer of phase change type extremely close to each other.

Such objects are attained by the present invention as described in (1) to (3), below.

(1) An optical recording medium having a mask layer and a recording layer of phase change type with an intervening intermediate dielectric layer such that an optical aperture can be formed in the mask layer by irradiation of reading light beam from the side of the mask layer, wherein the intermediate dielectric layer has a thickness of 5 to 70 nm; and the recording layer contains Ag, In, Sb and Te as its main components and Ge and/or N as its sub-component.

(2) An optical recording medium having a mask layer and a recording layer of phase change with an intervening intermediate dielectric layer such that an optical aperture can be formed in the mask layer by irradiation of reading light beam from the side of the mask layer, wherein near field light generated near the optical aperture is used in the reading; and the recording layer contains Ag, In, Sb and Te as its main components and Ge and/or N as its sub-component.

(3) An optical recording medium of the above (1) or (2) wherein the mask layer has a thickness of 10 to 25 nm.

DETAILED DESCRIPTION OF THE INVENTION

Figure 1:
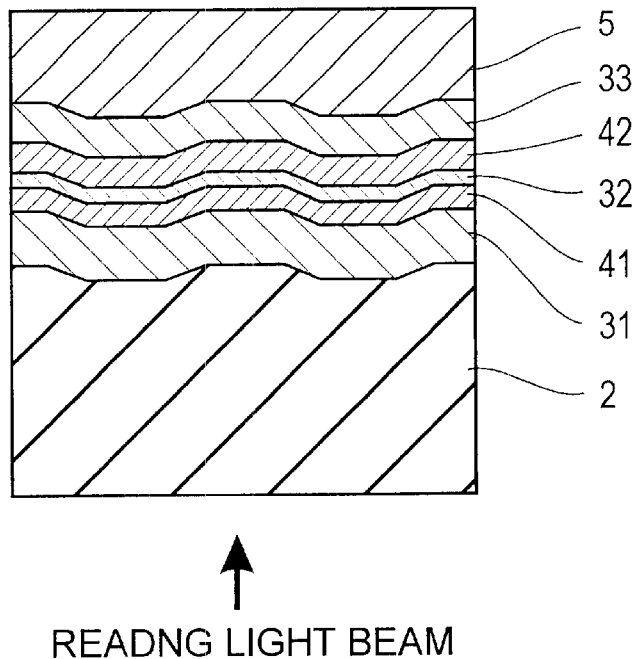
FIG. 1 is a cross sectional view of the optical recording medium according to an embodiment of the present invention.

FIG. 1 shows an embodiment of the optical recording medium of the present invention. This optical recording medium has a mask layer 41 and a recording layer 42 of phase change type formed thereon with an intervening intermediate dielectric layer 32. The reading light beam is irradiated from the side of the mask layer 41.

The reading light beam irradiated to the optical recording medium focuses at about the mask layer 41. In the mask layer 41, the reading light beam forms a beam spot having an intensity distribution similar to the Gaussian distribution, that is, a beam spot having an intensity distribution which is strongest in its center and reduces toward periphery of the spot. Accordingly, selective heating of the mask layer 41 in the region near the center of the beam spot to the temperature required for optical aperture formation can be accomplished by employing the reading light beam of adequate power. As a consequence, an optical aperture having a diameter smaller than that of the beam spot is formed in the mask layer 41 to thereby enable reading at super-resolution.

The present invention is applicable to an optical recording medium wherein the mask layer 41 and the recording layer 42 are formed extremely close to each other as in the case of the medium described in Appl. Phys. Lett., Vol.73, No.15, pp.2078–2080, 1998, supra. However, temperature elevation of the recording layer 42 upon formation of the optical aperture in the mask layer 41 increases as the mask layer 41 and the recording layer 42 become closer to each other, and the record mark formed in the recording layer 42 becomes more and more susceptible to erasure. The medium wherein these layer are extremely close to each other, therefore, suffers from reduced durability to repeated reading, and becomes unreadable after short period of operation. Moreover, the laser beam irradiated from the side of the mask layer 41 in the recording is of relatively high power since the laser beam irradiated should simultaneously form the optical aperture in the mask layer 41 and the record mark in the recording layer 42. Consequently, the region of the recording layer 42 in the vicinity of the optical aperture is heated to a temperature beyond the erasing temperature, and there arises the problem that the record marks in such region, namely the record marks that had already been formed in the track being recorded and the record marks formed in the adjacent track become erased.

In view of such situation, the recording layer 42 is formed in the present invention from a recording material which contains Ag, In, Sb and Te as its main components (which is hereinafter referred to as Ag—In—Sb—Te-based recording material). This phase change recording material has a crystallization temperature higher than the Ge—Sb—Te-based material used in Appl. Phys. Lett., Vol.73, No.15, pp.2078–2080, 1998, supra, and therefore, the optical recording medium produced will have better stability in reading. The thus produced optical recording medium is also less likely to suffer from the phenomena of the record mark erasure in the region in the vicinity of the beam spot upon recording. Such benefits are not fully realized by merely adopting the Ag—In—Sb—Te-based recording material, and in the present invention, Ge and/or N is added in the Ag—In—Sb—Te-based recording material as a sub-component. Ge and N increases the crystallization temperature of the Ag—In—Sb—Te-based recording material, and reading stability of the optical recording medium produced is remarkably improved. Drop in the reliability after storage at a high temperature is simultaneously suppressed. Use of Ge is particularly preferable since addition of Ge is not associated with any substantial drop in the reflectance difference (difference between the reflectance in crystalline state and the reflectance in amorphous state).

Addition of Ge and/or N in the Ag—In—Sb—Te-based recording material also results in the improvement of C/N in initial period of reading.

The optical recording medium to which the present invention is applied, namely, the optical recording medium wherein the mask layer 41 and the recording layer 42 are extremely close to each other is an optical recording medium therein the distance between the mask layer 41 and the recording layer 42 (thickness of the intervening intermediate dielectric layer 32) is as small as 5 to 70 nm, and in particular, 10 to 50 nm. It should be noted that, in the present invention, the length of the record mark is determined from the linear velocity of the medium and the recording frequency.

PREFERRED EMBODIMENT OF THE INVENTION

FIG. 1 shows an embodiment of the optical recording medium of the present invention. As shown in FIG. 1, the optical recording medium of the present invention comprises a substrate 2; an lower dielectric layer 31, a mask layer 41, an intermediate dielectric layer 32, a recording layer 42, an upper dielectric layer 33, and a protective layer 5 disposed on the substrate 2 in this order.

Substrate 2

In the optical recording medium of the present invention shown in FIG. 1, at least the reading light beam is directed through the substrate 2, and therefore, the substrate 2 is preferably formed of a material substantially transparent to the laser beam employed, for example, a resin or a glass. Use of a resin is preferable in view of ease of handling and low cost. Typical such resins include acrylic resins, polycarbonate, epoxy resins and polyolefins. The shape and the size of the substrate are not critical although the substrate is generally of disc shape having a thickness of about 0.1 to about 3 mm and a diameter of about 50 to about 360 mm. The substrate may be provided on its surface with a predetermined pattern of grooves or the like for the purpose of tracking and addressing.

Figure 2:
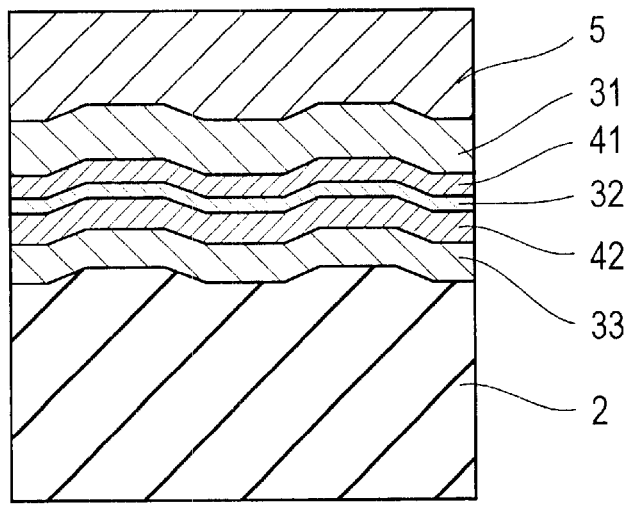
FIG. 2 is a cross sectional view of the optical recording medium according to another embodiment of the present invention.

The optical recording medium of the present invention may also have a constitution shown in FIG. 2. In the case of such constitution, the reading light beam is irradiated without passing through the substrate 2, and in this case, the recording layer 42, the intermediate dielectric layer 32, and the mask layer 41 are stack on the substrate 2 in this order, and other dielectric layers are also stack in reverse order.

Lower Dielectric Layer 31

The lower dielectric layer 31 is optionally provided for the purpose of preventing thermal deformation of the substrate 2 and controlling optical properties (e.g. reflectance) and heat transfer of the medium as a whole. In the course of recording, reading, and erasure, the mask layer 41 is heated to an elevated temperature and the underlying substrate 2 may become deformed if the substrate 2 comprises a resin of low thermal resistance. The lower dielectric layer 31 prevents such thermal deformation of the substrate 2. The lower dielectric layer 31 also has the function of controlling the cooling rate of the mask layer 41.

The material used for the lower dielectric layer 31 is not particularly limited, and any appropriate material may be selected from the dielectric materials. Exemplary materials include silicon nitride such as $Si_3N_4$, silicon oxide such as $SiO_2$, a mixture of zinc sulfide and silicon oxide, so-called LaSiON materials containing La, Si, O, and N, so-called SiAlON materials containing Si, Al, O, and N, SiAlON materials containing Yttrium, and NdSiON.

The thickness of the lower dielectric layer 31 is not particularly limited, and the lower dielectric layer 31 is generally formed to an appropriate thickness in the range of about 50 to about 300 nm to thereby prevent the deformation of the substrate 2.

The lower dielectric layer 31 is preferably formed by vapor deposition such as sputtering or evaporation.

Mask Layer 41

The mask layer 41 comprises a mask material which is capable of forming optical apertures. Exemplary mask materials which may be used in the present invention include nonlinear optical materials such as those described in JP-A 96926/1990 and mask materials described in JP-A 169094/1995. Other materials are also applicable as long as they are capable of forming optical apertures. In the present invention, the term "optical aperture" designates a region which has an increased transparency for the incident light, and such increased transparency may be the one realized through alteration in optical properties of the mask material such as transparency, reflectance, and refractive index, or alteration in configuration or volume.

The present invention is particularly effective when formation of optical apertures in the mask layer 41 is associated with severe thermal influence on the recording layer 42. Therefore, the present invention is particularly effective when the mask material employed is a material which is heated to a relatively high temperature in t he formation of the optical aperture, for example, a material which melts in the reading.

Exemplary mask materials which are preferably used in the present invention include a metal or an alloy which includes at least one element selected from Sb, Ge, Ga, Te, Sn, In, Se, Si, Ag, and Zn as its main component. More preferably, the mask material is a metal or an alloy containing at least Sb, and most preferably, the mask material is Sb.

The mask layer 41 is preferably formed to a thickness of 10 to 25 nm. When the mask layer 41 is too thin, function of the mask layer will be insufficient since transparency of the region other than the optical aperture will be excessively high. In contrast, when the mask layer 41 is too thick, a high power is required for the formation of the optical aperture and durability against repeated reading operations will be reduced.

The method used for forming the mask layer 41 is not particularly limited, and any adequate method may be selected from sputtering, evaporation, and the like.

Intermediate Dielectric Layer 32

The intermediate dielectric layer 32 is provided for separating the mask layer 41 and the recording layer 42. The material used for the intermediate dielectric layer 32 is not particularly limited, and at least one material may be selected from the dielectric materials as described above for the lower dielectric layer 31. The intermediate dielectric layer 32, however, may preferably comprise a material having a high resistance to thermal shock since the mask layer 41 and the recording layer 42 sandwiching intermediate dielectric layer 32 undergo repeated melting and crystallization. Exemplary such dielectric materials include silicon nitride, a mixture of zinc sulfide and silicon oxide, LaSiON, and $AlN—ZnS—SiO_2$.

The intermediate dielectric layer 32 is preferably formed to a thickness of 5 to 70 nm, and more preferably, to a thickness of 10 to 50 nm. When the intermediate dielectric layer 32 is too thin, the layer can no longer endure thermal shock, and when the intermediate dielectric layer 32 is too thick, the information that has been recorded at a high density will not be readable.

The intermediate dielectric layer 32 is preferably formed by vapor deposition such as sputtering or evaporation.

Recording Layer 42

The recording layer 42 contains Ag, In, Sb and Te as the main components, and Ge and/or N as the sub-component. When the atomic ratio of the main components is represented by the formula (I):

$$Ag_a In_b Sb_c Te_d \qquad (I)$$

a, b, c, and d are preferably in the range of: $0.02 \leq a \leq 0.20$, $0.02 \leq b \leq 0.20$, $0.35 \leq c \leq 0.80$, and $0.08 \leq d \leq 0.40$; and more preferably, in the range of: $0.02 \leq a \leq 0.10$, $0.02 \leq b \leq 0.10$, $0.50 \leq c \leq 0.75$, and $0.10 \leq d \leq 0.35$.

If the value of a is too small in formula (I), recrystallization of the record marks and hence, repetitive overwriting will become difficult. In contrast, if the value of a is too large, excess silver will solely diffuse into the antimony phase during the recording and erasure. This results in a reduced rewriting durability, less stability of both the record marks and the crystalline regions, and loss of reliability. Specifically, when the medium is stored at an elevated temperature, crystallization of the record marks will be promoted to invite drops of C/N and degree of modulation. In addition, the medium will undergo faster degradation in C/N and modulation degree in the repeated recording operations.

If the value of b is too small in formula (I), the record marks will become less amorphous to result in reduced degree of modulation and insufficient reliability. If the value of b is too large, reflectance of the regions other than the record marks will become reduced and the degree of modulation will be reduced.

If the value of c is too small in formula (I) difference in the reflectance created by the phase change will be sufficient, but erasure will be difficult due to markedly reduced rate of crystal transition. If the value of c is too large, the reflectance difference created by the phase change will be insufficient to invite drop in the degree of modulation.

If the value of d is too small, the recording layer will be difficult to render amorphous, and signal recording may become impossible. If the value of d is too large, crystal transition rate will be excessively low to render the erasure difficult.

Content of the germanium in the recording layer is preferably up to 25 at %, and more preferably up to 15 at %. When the germanium content is too high, properties of the Ag—In—Sb—Te-based recording material will not be fully realized. Germanium is preferably added in an amount of at least 1 at %, and more preferably in an amount of at least 2 at % in order to fully improve the reading stability by the germanium addition.

Nitrogen may be introduced in the recording layer, for example, by conducting the sputtering of the recording layer in an atmosphere containing nitrogen in addition to the rare gas such as argon. The flow ratio of the nitrogen gas to the rare gas may be set such that the nitrogen addition effect may be fully exerted and the nitrogen content may not become excessive, and typically in the range from 2/150 to 8/150. When the flow ratio is too low, nitrogen content in the recording layer will be insufficient to realize the benefits of the nitrogen addition. In contrast, when the flow ratio is too high, nitrogen content in the recording layer will be too high and the reflectance difference created by the phase change will be reduced to result in the insufficient degree of modulation.

The recording layer may optionally contain elements other than the main components and the sub-components as described above. Such additional elements may be element M which is at least one element selected from H, Si, C, V, W, Ta, Zn, Ti, Ce, Tb, Sn, Pb and Y. The element M is effective for improving rewriting durability, and more specifically, for preventing loss of erasability as a result of repetitive rewriting operations. Addition of element M is also effective for improving reliability under severe conditions such as hot humid conditions. Of the elements as mentioned above, inclusion of at least one element selected from V, Ta, Ce, and Y is preferred because the effects are more outstanding. Content of the element M in the recording layer is preferably up to 10 at %. When the content of the element M is too high, the reflectance difference created by the phase change will be reduced to invite insufficient degree of modulation.

The recording layer preferably consists essentially of the elements as described above. However, it is acceptable that Ag is partially replaced by Au; Sb is partially replaced by Bi; Te is partially replaced by Se; and In is partially replaced by Al and/or P.

The percent replacement of Ag by Au is preferably up to 50 at %, and more preferably up to 20 at %. When the percent replacement is too high, the record marks are likely to crystallize, and loss of reliability at elevated temperature is invited.

The percent replacement of Sb by Bi is preferably up to 50 at %, and more preferably up to 20 at %. When the percent replacement is too high, the recording layer will have an increased absorption coefficient, and the optical interference effect will be reduced. This results in reduced difference in reflectance between the crystalline region and the amorphous region, and hence, in reduced degree of modulation as well as in the difficulty of realizing a high C/N.

The percent replacement of Te by Se is preferably up to 50 at %, and more preferably up to 20 at %. When the percent replacement is too high, crystal transition rate will be too slow and the erasability will be insufficient.

The percent replacement of In by Al and/or P is preferably up to 40 at %, and more preferably up to 20 at %. When the percent replacement is too high, record marks will become less stable to result in the loss of reliability. The proportion of Al and P is arbitrary.

The recording layer is preferably formed to a thickness of 9.5 to 50 nm, and more preferably, to a thickness of 13 to 30 nm. When the recording layer is too thin, growth of the crystalline phase will be difficult and the reflectance difference created by the phase change will be insufficient. When the recording layer is too thick, a large amount of silver will diffuse in the thickness direction of the recording layer upon formation of the record marks, and proportion of the silver diffusing in the in-plane direction will be reduced to result in the reduced reliability of the recording layer. An excessively thick recording layer also results in the reduced reflectance and in the reduced degree of modulation.

The composition of the recording layer may be identified by electron probe microanalysis (EPMA), X-ray microanalysis, ICP, etc.

The recording layer is preferably formed by sputtering. The sputtering conditions are not particularly limited. For example, when a recording layer comprising a material including two or more elements are to be formed, the sputtering may be conducted by using an alloy target, or alternatively, by multi-target sputtering wherein two or more targets are used.

Upper Dielectric Layer 33

The upper dielectric layer 33 is an optional layer, and has the function of controlling the cooling rate of the recording layer 42. The material used for the upper dielectric layer 33 is not particularly limited, and any material may be selected from the dielectric materials as described above for the intermediate dielectric layer 32. The upper dielectric layer 33, however, may preferably comprise a material of relatively high thermal conductivity for improving the cooling effects of the layer. Also, the upper dielectric layer 33 may preferably comprise a material which is resistant to deformation and breakage by thermal shock since the upper dielectric layer 33 is exposed to repeated thermal shock. Exemplary dielectric materials include, silicon nitride, a mixture of zinc sulfide and silicon oxide, and AlN—ZnS—$SiO_2$.

The upper dielectric layer 33 is preferably formed to a thickness of 8 to 30 nm, and more preferably, to a thickness of 15 to 25 nm. When the upper dielectric layer 33 is too thin, the layer may undergo breakage by thermal shock, and when the upper dielectric layer 33 is too thick, cooling rate of the recording layer 42 will become reduced to detract from good record marks and high C/N.

The upper dielectric layer 33 is preferably formed by vapor deposition such as sputtering or evaporation.

Protective Layer 5

The protective layer 5 is optionally provided for improving scratch resistance and corrosion resistance. Preferably, the protective layer is formed of an organic material, and typically, from a radiation curable compound or a composition thereof which cures with a radiation such as electron or UV radiation. The protective layer is generally formed to a thickness of about 0.1 to about 100 $\mu$m thick by any of conventional techniques such as spin coating, gravure coating, spray coating, and dipping.

It should be noted that a reflective layer may be optionally provided between the protective layer 5 and the upper dielectric layer 33. The reflective layer is typically formed from a metal of high reflectance such as Al, Au, Ag, Pt, and Cu or from an alloy containing at least one of such metals. The reflective layer may be alternatively formed from a material of high transparency such as Si and Ge.

Recording and Reading

The present invention is applicable to an optical recording medium of the type wherein record marks are formed by changing crystalline non-recorded region to amorphous or micro-crystalline state (hereinafter referred to as the optical recording medium of first type), and to an optical recording medium of the type wherein record marks are formed by changing amorphous or micro-crystalline non-recorded region to crystalline state (hereinafter referred to as the optical recording medium of second type).

First, reading and erasure in the optical recording medium of the first type is described.

Since the as-deposited recording layer 42 generally remains amorphous, it is crystallized by applying a DC laser beam thereto to heat it, followed by cooling. This crystallization is generally known as initialization. A general practice for initialization is to crystallize the recording layer in a solid phase without melting it although it is acceptable that the recording layer is once melted. Although the laser beam of the initialization may be directed from the side of the mask layer 41, the laser beam is preferably irradiated from the side of the recording layer 42 without passing through the mask layer to thereby reduce the damage of the mask layer 41 by the heat applied in the initialization. It should be noted that, if the as-deposited mask layer 41 is amorphous, and crystallization is required for the functioning of the mask layer 41 as the mask layer, the mask layer 41 may be crystallized simultaneously with the crystallization of the recording layer 42.

In the recording, the recording laser beam is generally irradiated from the side of the mask layer 41. The power of the recording laser beam is adjusted such that formation of the optical aperture in the mask layer 41 and formation of the record mark in the recording layer 42 are simultaneously accomplished. Beam spot of a laser beam has an intensity distribution on the plane irradiated, and a record mark of any desired size with a diameter smaller than that of the beam spot can be formed by adequately adjusting the power of the recording laser beam.

In the reading, a laser beam of the power capable of forming the optical aperture in the mask layer 41 and reading the record mark in the recording layer 42 without erasing is irradiated from the side of the mask layer 41. By the mechanism similar to the formation of small record marks as described above, a small optical aperture of desired size having a diameter smaller than that of the beam spot can be formed in the mask layer 41 to enable the reading beyond diffraction limit. The optical aperture formed in the mask layer 41 disappears immediately after the passing of the beam spot, and cross talk by the adjacent record mark is thereby suppressed.

It should be noted that the optical recording medium of the present invention may have a constitution such that the reading light beam reflects at the recording layer 42 to pass through the optical aperture of the mask layer 41 for the second time and go out from the medium, or a constitution such that the reading light beam passes through the recording layer 42 to go out from the medium. In the former case, the optical detector for detecting the reading light beam can be integrated with the reading light beam irradiating means (optical pickup), and the structure of the reading device can be simplified and the need for adjusting the optical axis between the optical pickup and the optical detector is omitted.

In the erasure, the recording layer 42 is irradiated with a laser beam of the power capable of erasing the record mark. It is generally preferable to accomplish the overwriting by modulating the intensity of the laser beam between the recording power level and erasing power level.

Next, second type of the optical recording medium wherein record marks are crystalline is explained. In the medium of second type, crystalline record marks are formed by irradiating the amorphous or microcrystalline recording layer 42 with the recording laser beam. In the reading, the record marks are read out as in the case of the medium of the first type. Upon erasure, the crystalline record marks should be changed to amorphous or microcrystalline state, and erasure requires irradiation of high power laser beam. As a consequence, erasure is likely to involve the erasure of the record marks in the vicinity of the beam spot. Therefore, the optical recording medium of this type is substantially used as a write-once-read-many type optical recording medium. As described above, overwriting may be difficult in the optical recording medium of this type. The medium of this type, however, has the merit that the recording layer needs no initialization.

The level of the recording power, the reading power, and the erasing power actually employed in practice can be determined by experiments.

EXAMPLES

Examples of the present invention are given below by way of illustration and not by way of limitation.

Example 1

A slide glass was used for the substrate 2. Samples for evaluation were prepared by forming an lower dielectric layer 31, a mask layer 41, an intermediate dielectric layer 32, a recording layer 42, and an upper dielectric layer 33 on the substrate 2 in this order.

The lower dielectric layer 31, the intermediate dielectric layer 32, and the upper dielectric layer 33 were formed by reactive sputtering in argon and nitrogen (Ar+N$_2$) atmosphere using a Si target. The lower dielectric layer 31 was formed to a thickness of 170 nm; the intermediate dielectric layer 32 was formed to a thickness of 20 nm; and the upper dielectric layer 33 was formed to a thickness of 20 nm.

The mask layer 41 was formed by sputtering in argon atmosphere using Sb for the target. The mask layer 41 was formed to a thickness of 15 nm.

The recording layer 42 formed was the one containing the components as shown in Table 1 for the main components and the sub-components. In the samples having the recording layer containing Ag—In—Sb—Te as the main components, the recording layer 42 was prepared by sputtering in argon atmosphere or argon and nitrogen (N$_2$+Ar) atmosphere (in the case of nitrogen introduction) using Ag—In—Sb—Te alloy or Ag—In—Sb—Te—Ge alloy for the target. The atomic ratio of the main components was:

a=0.07, b=0.05, c=0.59, and d=0.29 in formula (I): Ag$_a$In$_b$Sb$_c$Te$_d$. In the sample having the recording layer containing Ge—Sb—Te as its main components, the recording layer 42 was prepared by sputtering in argon atmosphere by using Ge$_2$Sb$_2$Te$_5$ for the target. The recording layer 42 was formed to a thickness of 15 nm. Ge content of the recording layer 42 is shown in Table 1. Flow ratio of the atmospheric gas (N$_2$/Ar) in the formation of the recording layer 42 is also shown in Table 1.

Evaluation of Properties

Crystallization temperature of the recording layer 42 was determined by placing each sample on a heating stage, irradiating the sample with the laser beam through the substrate 2, and measuring the temperature of the reflectance change. The samples were also evaluated for the reflectance difference created by the phase change.

TABLE 1

| Sample No. | Main components | Sub-component | Ge content (at %) | N$_2$/Ar | Crystallization temperature (° C.) | Reflectance difference (%) |
|---|---|---|---|---|---|---|
| 1 (Comparative) | Ag—In—Sb—Te | — | — | — | 175.5 | 3.6 |
| 2 | Ag—In—Sb—Te | Ge | 2 | — | 185 | 3.6 |
| 3 | Ag—In—Sb—Te | Ge | 5 | — | 201 | 3.7 |
| 4 | Ag—In—Sb—Te | Ge | 10 | — | 231 | 3.4 |
| 5 | Ag—In—Sb—Te | N | — | 5/150 | 193.5 | 3.1 |
| 6 | Ag—In—Sb—Te | N | — | 10/150 | 207 | 2.3 |
| 7 (Comparative) | Ge—Sb—Te | — | — | — | 148.5 | 2.8 |

The benefits of the present invention are evident from the results shown in Table 1. The recording layers containing Ag—In—Sb—Te for the main component and Ge or N for the sub-component had crystallization temperatures markedly higher than the recording layer comprising the Ge—Sb—Te alloy. No substantial decrease in the reflectance difference was observed with the addition of the sub-component in the samples wherein Ge was added as the sub-component.

Example 2

A substrate 2 in the form of a disc having a diameter of 120 mm and a thickness of 0.6 mm was prepared by injection molding polycarbonate. Grooves were simultaneously formed in the injection molding of the substrate 2. On the grooved surface of the substrate 2, there were formed an lower dielectric layer 31, a mask layer 41, an intermediate dielectric layer 32, a recording layer 42, and an upper dielectric layer 33 in this order by the procedure as described for the evaluation sample Nos. 1 to 7 in Example 1 to produce optical recording disk sample Nos. 1 to 7.

The thus produced samples were placed on an optical recording medium evaluator (Laser beam wavelength: 638 nm; NA: 0.6), and the recording layer 42 in amorphous state was recorded by irradiating recording light beam through the mask layer 41 under the conditions as described below:

Linear velocity: 2.0 m/s

Recording power: the value at which C/N is in its maximum

Recorded signal: single signal (mark length: 150 nm) The recorded samples were read by selecting an optimal combination of the linear velocity and the reading power to maximize the C/N. It should be noted that the reading light beam was came in through the mask layer 41, and the beam reflected at the recording layer 42 went out through mask layer 41 and the substrate 2. The linear velocity in the reading was selected in the range of 2.0 to 6.0 m/s. Formation of the optical aperture in the mask layer 41 in the reading under such conditions was preliminarily confirmed.

C/N was 15 dB in Sample No. 7 while C/N was 23 dB in Sample Nos. 1 to 4 and 21 dB in Sample No. 6, and improvement in C/N of 8 dB at maximum was observed. C/N was 13 dB in Sample No. 6 due to the reduced reflectance difference.

Japanese Patent Application No. 368538/1998 is incorporated herein by reference.

Although some preferred embodiments have been described, many modifications and variations may be made thereto in the light of the above teachings. It is therefore to be understood that, within the scope of the appended claims, the invention may be practiced otherwise than as specifically described.

What is claimed is:

1. An optical recording medium having a mask layer and a recording layer of phase change type with an intervening intermediate dielectric layer such that an optical aperture can be formed in the mask layer by irradiation of reading light beam from the side of the mask layer, wherein the intermediate dielectric layer has a thickness of 5 to 70 nm; and the recording layer contains Ag, In, Sb and Te as its main components and Ge and/or N as its sub-component.

2. An optical recording medium having a mask layer and a recording layer of phase change type with an intervening intermediate dielectric layer such that an optical aperture can be formed in the mask layer by irradiation of reading light beam from the side of the mask layer, wherein near field light generated near the optical aperture is used in the reading; and the recording layer contains Ag, In, Sb and Te as its main components and Ge and/or N as its sub-component.

3. An optical recording medium according to claim 1 wherein the mask layer has a thickness of 10 to 25 nm.

4. An optical recording medium according to claim 1, wherein the mask layer comprises a mask material that melts upon irradiation by the reading light beam.

5. An optical recording medium according to claim 1, wherein the mask material comprises a metal, or an alloy including at least one element, selected from the group consisting of Sb, Ge, Ga, Te, Sn, In, Se, Si, Ag, and Zn as its main components.

6. An optical recording medium according to claim 5, wherein the mask material comprises a metal or an alloy containing at least Sb.

7. An optical recording medium according to claim 6, wherein the mask material is Sb.

8. An optical recording medium according to claim 1, wherein the intermediate dielectric layer comprises at least one of silicon nitride, a mixture of zinc sulfide and silicon oxide, LaSiON, and AlN—ZnS—SiO$_2$.

9. An optical recording medium according to claim 1, wherein the intermediate dielectric layer has a thickness of 10 to 50 nm.

10. An optical recording medium according to claim 1, wherein the main components of the recording layer are represented by the formula (I):

$$Ag_a In_b Sb_c Te_d \qquad (I)$$

wherein a, b, c, and d are in the range of: $0.02 \leq a \leq 0.20$, $0.02 \leq b \leq 0.20$, $0.35 \leq c \leq 0.80$, and $0.08 \leq d \leq 0.40$.

11. An optical recording medium according to claim 10, wherein the range is: $0.02 \leq a \leq 0.10$, $0.02 \leq b \leq 0.10$, $0.50 \leq c \leq 0.75$, and $0.10 \leq d \leq 0.35$.

12. An optical recording medium according to claim 1, wherein the recording layer optionally contains at least one element selected from the group consisting of H, Si, C, V, W, Ta, Zn, Ti, Ce, Tb, Sn, Pb and Y.

13. An optical recording medium according to claim 1, wherein in the recording layer, Ag is partially replaced by Au, Sb is partially replaced by Bi, Te is partially replaced by Se, and In is partially replaced by Al and/or P.

14. An optical recording medium according to claim 13, wherein the Ag is partially replaced by up to 20 at % of Au, the Sb is partially replaced by up to 20 at % of Bi, the Te is partially replaced by up to 20 at % of Se, and the In is partially replaced by up to 20 at % of the Al and/or P.

15. An optical recording medium according to claim 1, wherein the recording layer has a thickness of 9.5 to 50 nm.

16. An optical recording medium according to claim 15, wherein the recording layer thickness is 13 to 30 nm.

17. An optical recording medium according to claim 1, wherein the optical recording medium contains an optional lower dielectric layer, an optional upper dielectric layer, and an optional protective layer.

* * * * *